(12) United States Patent
Capasso et al.

(10) Patent No.: US 6,728,282 B2
(45) Date of Patent: Apr. 27, 2004

(54) ENGINEERING THE GAIN/LOSS PROFILE OF INTERSUBBAND OPTICAL DEVICES HAVING HETEROGENEOUS CASCADES

(75) Inventors: Federico Capasso, Westfield, NJ (US); Alfred Yi Cho, Summit, NJ (US); Rafaelle Colombelli, Hoboken, NJ (US); Claire F. Gmachl, New Providence, NJ (US); Hock Min Ng, Mountainside, NJ (US); Deborah Lee Sivco, Warren, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 126 days.

(21) Appl. No.: 09/883,542

(22) Filed: Jun. 18, 2001

(65) Prior Publication Data

US 2002/0191658 A1 Dec. 19, 2002

(51) Int. Cl.$^7$ .............................. H01S 5/00; H01S 3/11

(52) U.S. Cl. .............................. 372/45; 372/17; 372/46

(58) Field of Search .............................. 372/45, 17, 46

(56) References Cited

U.S. PATENT DOCUMENTS

| | | | | |
|---|---|---|---|---|
| 5,126,803 A | * | 6/1992 | Hager et al. | 357/17 |
| 5,457,709 A | | 10/1995 | Capasso et al. | 372/45 |
| 5,509,025 A | | 4/1996 | Capasso et al. | 372/45 |
| 6,055,254 A | | 4/2000 | Capasso et al. | 372/45 |
| 6,148,012 A | | 11/2000 | Capasso et al. | 372/45 |
| 6,324,199 B1 | * | 11/2001 | Capasso et al. | 372/45 |
| 6,463,088 B1 | * | 10/2002 | Baillargeon et al. | 372/46 |

OTHER PUBLICATIONS

A. Tredicucci et al., *A multiwavelength...*, Nature, vol. 396, pp.350–353 (Nov. 1998).

(List continued on next page.)

*Primary Examiner*—George Eckert
*Assistant Examiner*—Joseph Nguyen

(57) ABSTRACT

An optical device includes a stack of at least two different intersubband (ISB) optical sub-devices in which the gain/loss profiles of the individual ISB sub-devices are mutually adapted, or engineered, so as to generate a predetermined overall function for the combination. We define this combination device as being heterogeneous since not all of the individual ISB sub-devices are identical to one another. Illustratively, the parameters of each individual ISB sub-device that might be subject to this engineering process include: the peak energy of the ISB optical transitions (emission or absorption) associated with each RT region, the position of each sub-device in the stack; the oscillator strengths of these ISB transitions; the energy bandwidth of each transition; and the total length of the RT and I/R regions of each ISB sub-device. In one embodiment, our approach may be used to engineer a gain profile that has peaks at a multiplicity of different wavelengths, thus realizing a multi-wavelength ISB optical source in which the applied electric field self-proportions itself so that each individual ISB sub-device experiences the appropriate field strength for its particular design. Alternatively, the gain profile may be engineered to be relatively flat over a predetermined wavelength range. In another embodiment, our approach may be used to generate a function that compensates for a characteristic of another device. For example, our heterogeneous ISB device may be engineered to have a gain profile that compensates for the loss profile of another device. Alternatively, the gain/loss profile may be engineered to produce a nonlinear refractive index profile in our device that compensates for that of another device (e.g., an optical fiber).

11 Claims, 6 Drawing Sheets

OTHER PUBLICATIONS

C. Gmachl et al., *Dependence of the Device...*, IEEE J. of Selected Topics in QE, vol. 5, No. 3, pp. 808–816 (May/Jun. 1999).

C. Sirtori et al., *Quantum cascade...*, Appl. Phys. Lett., vol. 66, No. 24, pp. 3242–3244 (Jun. 1995) (May 1998).

J. Faist et al., *High power mid–infrared...*, Appl. Phys. Lett., vol. 68, No. 26, pp. 3680–3682 (Jun. 1996) (May 1998).

G. Scamarcio et al., *High–Power Infrared...*, Science, vol. 276, pp. 773–776 (May 1997).

Tredicucci et al., *High performance interminiband...*, Appl. Phys. Lett., vol. 73, No. 15, pp. 2101–2103 (Oct. 1998).

C. Gmachl et al., *Noncascaded intersubband...*, Appl. Phys. Lett., vol. 73, No. 26, pp. 3830–3832 (Dec. 1998).

F. Capasso et al., *Infrared(4–11µm)...*, Solid State Comm., vol. 102, No. 2–3, pp. 231–236 (1997).

\* cited by examiner

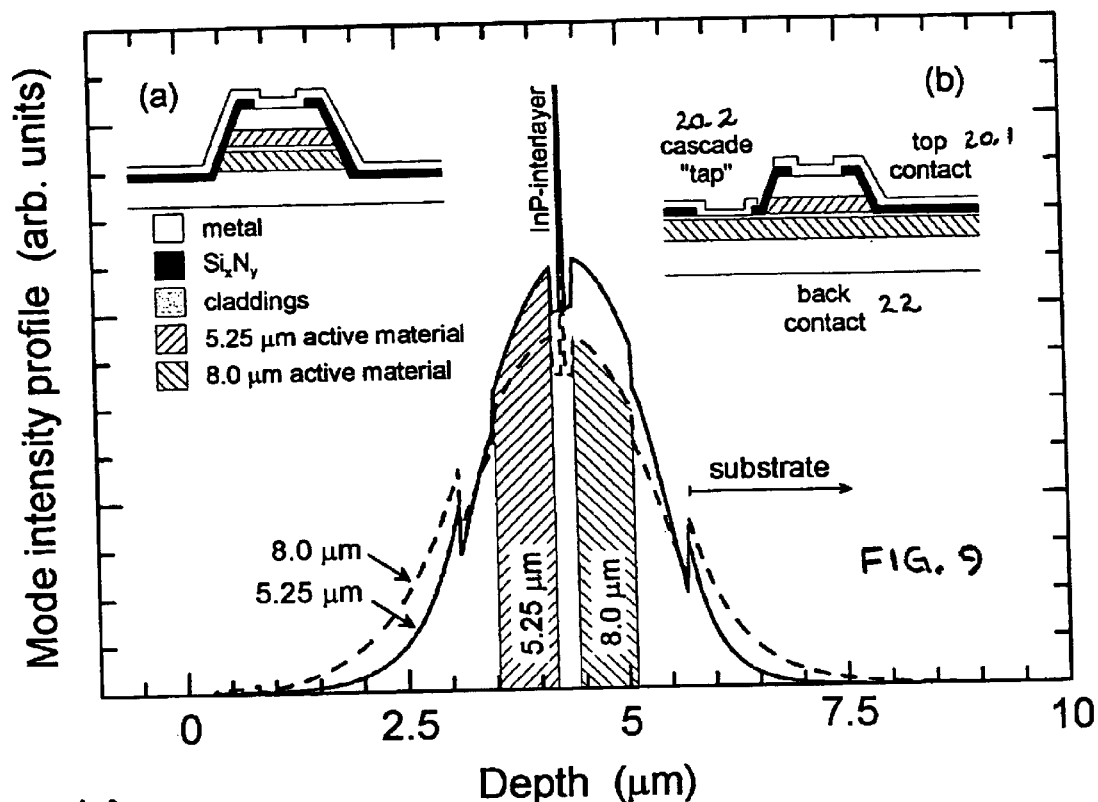
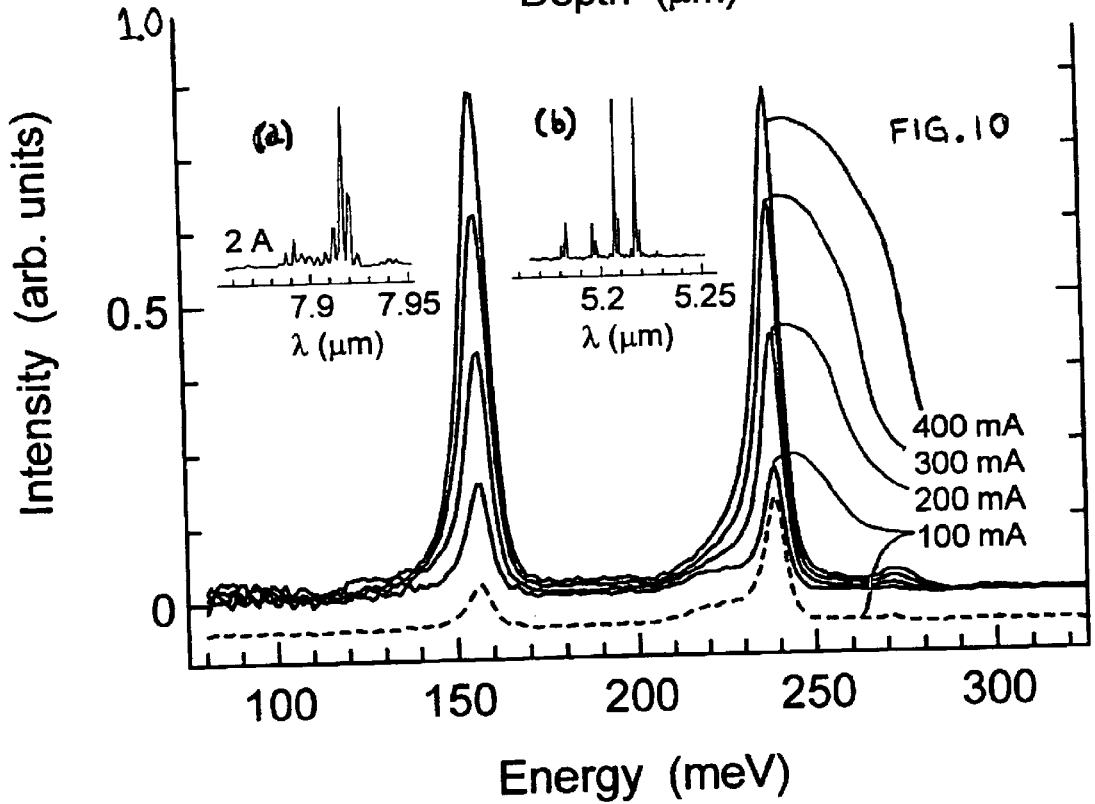

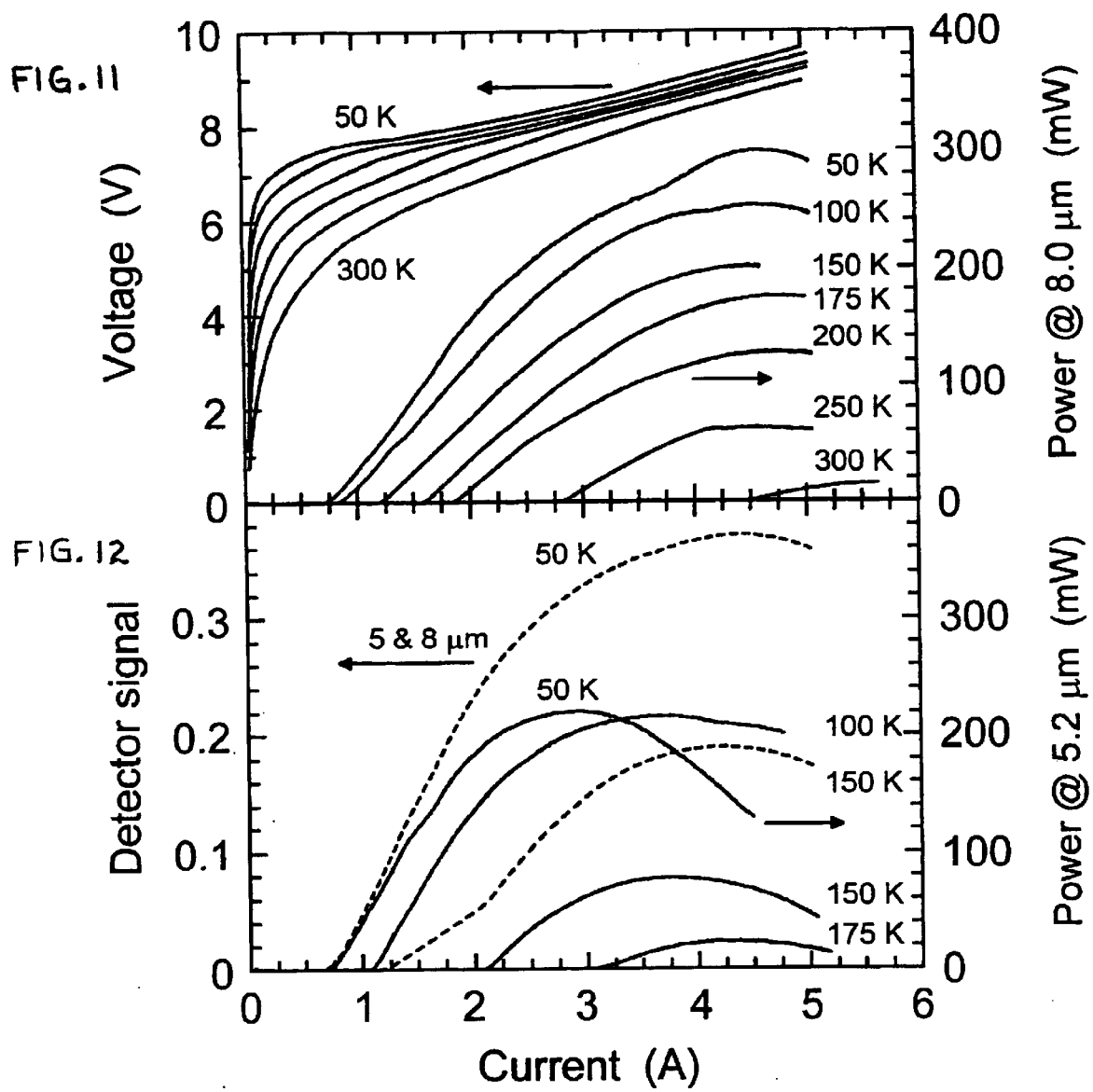

ENGINEERING THE GAIN/LOSS PROFILE OF INTERSUBBAND OPTICAL DEVICES HAVING HETEROGENEOUS CASCADES

GOVERNMENT CONTRACTS

This invention was made with Government support under Contract No. DAAD19-00-C-0096 awarded by the DARPA/US Army Research Office. The Government has certain rights in this invention.

FIELD OF THE INVENTION

This invention relates generally to intersubband (ISB) optical devices and, more particularly, to engineering the gain/loss profile of ISB devices in order to realize an optical device having a predetermined function or characteristic.

BACKGROUND OF THE INVENTION

The term ISB optical device embraces light emitters (e.g., lasers, spontaneous emitters) as well as light absorbers (e.g., photodetectors). Thus, an ISB light emitter may include a single stage, non-cascaded device of the type described in a paper by C. Gmachl et al., *Appl. Phys. Lett.*, Vol. 73, No. 26, pp. 3830–3832 (December 1998), which is incorporated herein by reference. The term may also include a multiple stage, cascaded device of the type described in the F. Capasso et al., *Solid State Communications*, Vol. 102, No. 2–3, pp. 231–236 (1997) and J. Faist et al., *Science*, Vol. 264, pp. 553–556 (1994), which are also incorporated herein by reference; i.e., a quantum cascade (QC) device that includes a multiplicity of essentially identical repeat units (or active regions). Each active region, in turn, includes a multiplicity of essentially identical radiative transition (RT) regions and a multiplicity of essentially identical injection/relaxation (I/R) regions interleaved with the RT regions. The RT regions, which include quantum well regions interleaved with barrier regions, as well as the I/R regions each comprise a multiplicity of semiconductor layers. At least some of the layers of each I/R region are doped, but in any case the I/R regions as well as the RT regions are unipolar. In addition, the term ISB active region is intended to embrace both diagonal radiative (i.e., optical) transitions as well as vertical optical transitions. A diagonal transition involves optical transitions between upper and lower energy levels or states where the wave functions (the moduli squared) corresponding to the levels are substantially localized in different quantum wells of the same RT region for all repeat units. See, also F. Capasso et al., U.S. Pat. No. 5,457,709 issued on Oct. 10, 1995, which is incorporated herein by reference. On the other hand, in the case of a vertical transition the excited and lower energy states are both substantially localized in the same quantum well of a single RT region for all repeat units. See, F. Capasso et al., U.S. Pat. No. 5,509,025 issued on Apr. 16, 1996, which is also incorporated herein by reference. Both types of transitions are also described in the article by F. Capasso et al., supra. This article, as well as the '025 patent, point out that the I/R regions of a vertical transition QC laser may include minibands and a minigap between the minibands to form an effective Bragg reflector for electrons in the excited state and to ensure swift electron escape from the lower states.

In addition, the source may be designed to operate at a single center wavelength, as in the papers discussed above, or it may operate in multiple wavelengths as described, for example, by A. Tredicucci et al., *Nature*, Vol. 396, pp. 350–353 (November 1998) and by F. Capasso et al., U.S. Pat. No. 6,148,012 issued on Nov. 14, 2000, both of which are incorporated herein by reference.

Yet another form of ISB optical device is known as a superlattice (SL) laser in which the wavefunctions of the laser levels are spread over a multiplicity of quantum wells within each RT region. Laser action is achieved through unipolar injection by inter miniband tunneling. See, G. Scamarcio et al., *Science*, Vol. 276, pp. 773–776 (May 1997), which is incorporated herein by reference. The SLs may be pre-biased as described by A. Tredicucci et al., *Appl. Phys. Lett.*, Vol. 73, No. 15, pp. 3101–3103 (October 1998) and F. Capasso et al., U.S. Pat. No. 6,055,254 issued on Apr. 25, 2000, both of which are also incorporated herein by reference.

One characteristic of the ISB devices described above is the cascading scheme in which electrons traverse a stack of many (e.g., 30–100) essentially identical active regions. As noted above, in the prior art all stages of the cascade (i.e., all of the repeat units) are essentially identical to one another. We refer to such devices as having a homogeneous cascade. Although laser based on homogeneous cascades exhibit low threshold currents, high average power outputs and large slope efficiency, to date they have been limited to applications in which they function as narrow-band light emitters, typically mid-infrared lasers.

Thus, a need remains in the art for an approach that more fully exploits the capabilities of ISB devices, and in particular enables them to be employed to generate essentially arbitrary gain/loss profiles to satisfy a broad range of applications.

SUMMARY OF THE INVENTION

In accordance with one aspect of our invention, an optical device includes a stack of at least two different ISB optical sub-devices in which the gain/loss profiles of the individual ISB sub-devices are mutually adapted, or engineered, so as to generate a predetermined overall function for the combination. We define this combination device as being heterogeneous since not all of the individual ISB sub-devices are identical to one another and refer to it hereinafter as a HISB device. Illustratively, the parameters of each individual ISB sub-device that might be subject to this engineering process include: the peak energy of the ISB optical transitions (emission or absorption) associated with each RT region, the position of each sub-device in the stack; the oscillator strengths of these ISB transitions; the energy bandwidth of each transition; and the total length of the RT and I/R regions of each ISB sub-device. In one embodiment, our approach may be used to engineer a gain profile that has peaks at a multiplicity of different wavelengths, thus realizing a multi-wavelength HISB optical source in which the applied electric field self-proportions itself so that each individual ISB sub-device experiences the appropriate field strength for its particular design. Alternatively, the gain profile may be engineered to be relatively flat over a predetermined wavelength range. In another embodiment, our approach may be used to generate a function that compensates for a characteristic of another device. For example, our HISB device may be engineered to have a gain profile that compensates for the loss profile of another device. Alternatively, the gain/loss profile may be engineered to produce a nonlinear refractive index profile in our device that compensates for that of another device (e.g., an optical fiber).

BRIEF DESCRIPTION OF THE DRAWING

Our invention, together with its various features and advantages, can be readily understood from the following more detailed description taken in conjunction with the accompanying drawing, in which:

FIG. 9 shows the mode intensity profiles for a two-wavelength HISB laser in accordance with another embodiment of our invention. The profiles were calculated in the direction normal to the waveguide layers and were calculated for emission wavelengths of 8 $\mu$m (dashed curve) and 5.25 $\mu$m (solid curve). The location and extent of the respective stack of active regions (RT and I/R regions) is indicated by the crosshatched areas under the curves. Inset (a) is a schematic cross-sectional view a deep-etched embodiment of the two-wavelength HISB laser, and Inset (b) is a schematic cross-sectional view a tapped-cascade embodiment of the two-wavelength HISB laser;

FIG. 10 shows the electroluminescence spectra of round, deep-etched mesa, two-wavelength HISB optical emitters of the type depicted in FIG. 9, Inset (a). These emitters were operated in a pulsed mode at a heat sink temperature of 10 K. The dashed curve shows the spectrum as-measured at 100 mA of pump current; the solid curves show the spectrum as-corrected for wavelength dependent collection efficiency at 100–400 mA of pump current. The corresponding current densities were 0.88, 1.77, 2.65 and 3.54 kA/cm$^2$. The insets show the above-threshold emission spectra for a deep-etched ridge waveguide HISB laser operated at 2 A of peak pump current; i.e., approximately 3 times the threshold current. The observed non-monotonous envelope over the Fabry-Perot modes is often attributed to the formation of sub-cavities along the laser ridge, which may be caused by crystal defects. In fact, the growth of the etch-stop layer in the tapped-cascade device involved transferring the wafer between two growth chambers twice. Therefore, a higher defect density at the growth interruption interfaces is likely. Inset (a) of FIG. 13 shows a spectrum with a smooth envelope.

FIGS. 11–12 show light power (L) output and voltage (V) versus current (I) characteristics of a deep-etched, ridge waveguide HISB laser operated in a pulsed mode. The laser was 12 $\mu$m wide and 2.25 mm long. Measurements were made at heat sink temperatures of 50–300 K. FIG. 11 shows the I-V and L-I characteristics for the emission at 8.0 $\mu$m; FIG. 12 shows the L-I characteristics (solid curves) at an emission wavelength of 5.2 $\mu$m, as well as the uncalibrated L-I characteristic with light of both waveguides reaching the detector simultaneously (dashed curves). The lasers were pulse-operated with current pulses having a duration of about 50 ns and a repetition rate of about 84.2 kHz.

Figure 4:
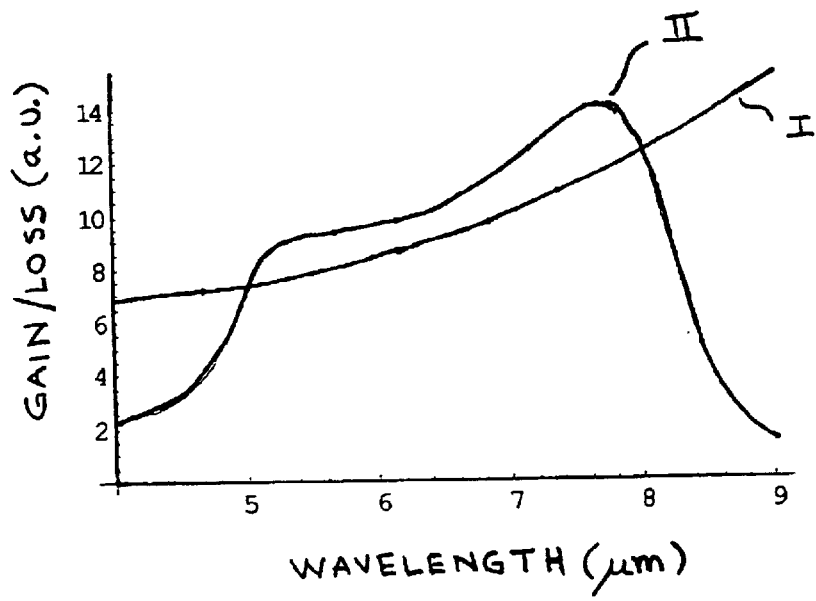
FIG. 4 shows calculated graphs of a quadratic Drude-loss function (Curve I) of a typical mid-infrared optical waveguide and a compensating gain profile (Curve II) of a HISB device in accordance with another embodiment of our invention.
Figure 7:
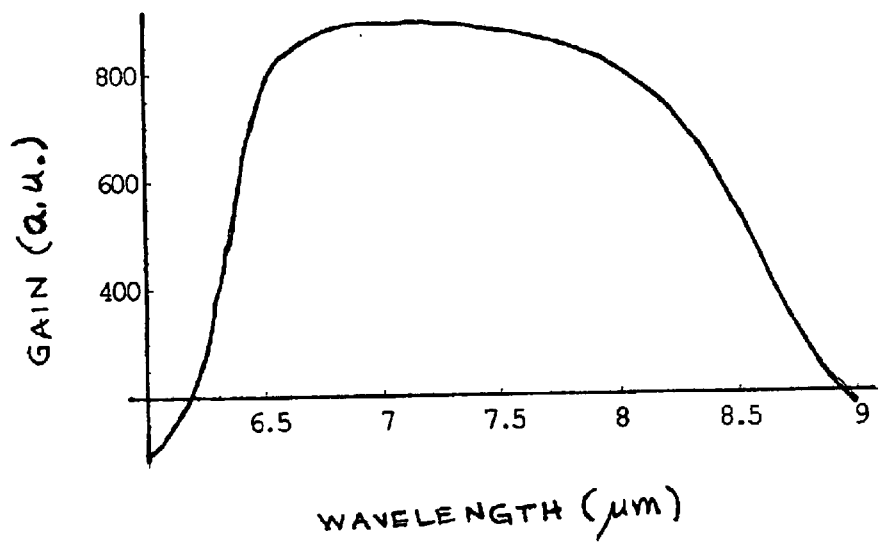
FIG. 7 shows the calculated gain profile of the embodiment of FIG. 6.
Figure 8:
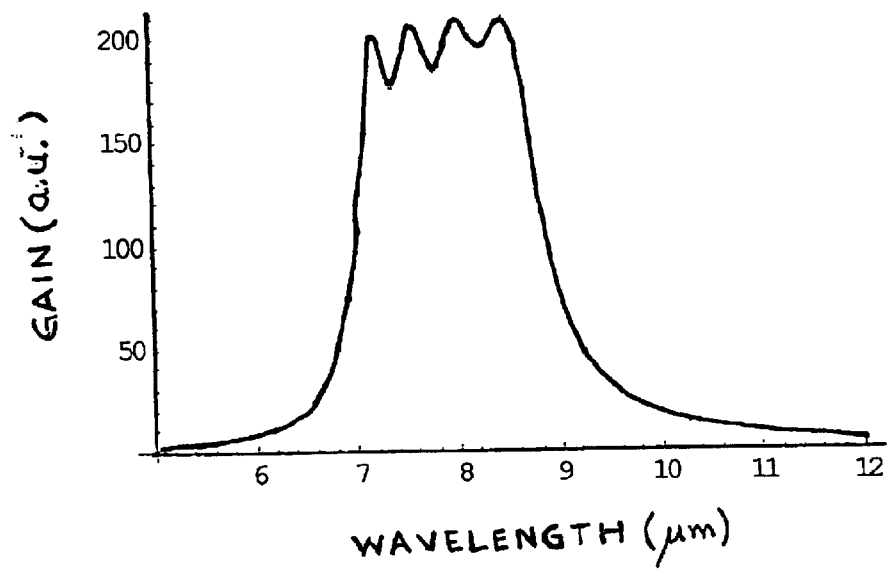
FIG. 8 shows a calculated gain profile of a HISB optical device having peaks at four different wavelengths, thus rendering the device capable of simultaneously generating radiation at four different wavelengths, in accordance with one more embodiment of our invention.

In the interest of clarity and simplicity, FIGS. 1–3 and 5, as well as Insets (a) and (b) of FIG. 9, have not been drawn to scale. In addition, the ordinates of the graphs of FIGS. 4, 7 and 8 are labeled arbitrary units (a.u.) but are proportional to cm$^{-1}$.

DETAILED DESCRIPTION OF THE INVENTION

General Structure of Homogeneous ISB Devices

Figure 1:
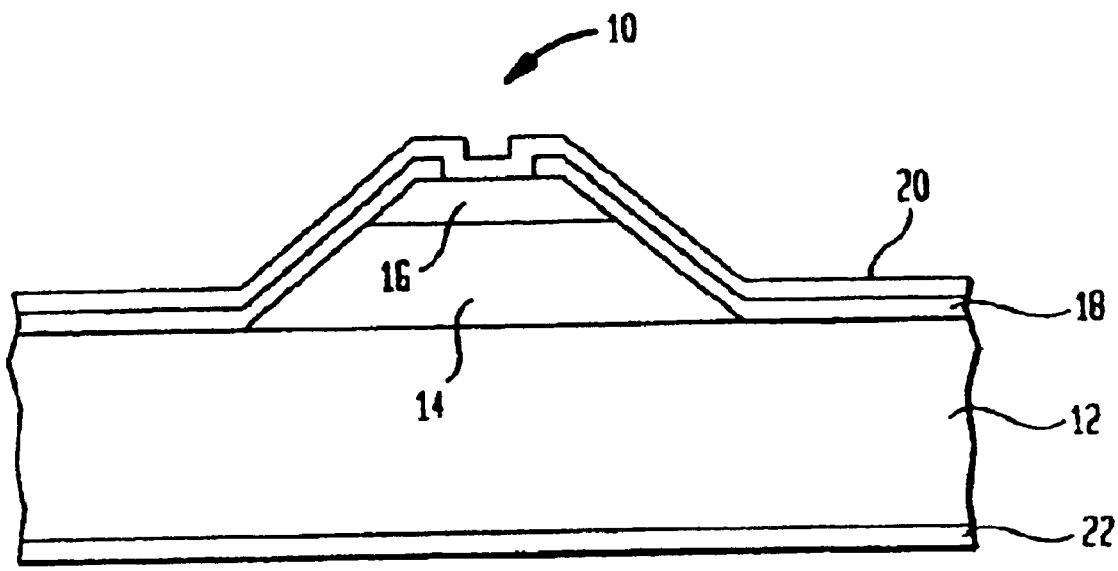
FIG. 1 is a schematic, cross-sectional view of a prior art homogeneous ISB optical device.

With reference now to FIG. 1, a prior art homogeneous ISB semiconductor light emitter (e.g., a QC laser) 10 comprises a core region 14 sandwiched between an upper cladding region 16 and a lower cladding region 12. The core region includes the active region of the laser. The active region, in turn, includes a multiplicity of essentially identical repeat units or stages; that is, the overall device is termed homogeneous. In a typical design, each stage includes a one radiative transition (RT) region and an adjacent injection/relaxation (I/R) region. All stages are essentially identical to one another.

The term ISB in general refers to the well-known unipolar nature of the optical and electronic transitions that take place in the RT and I/R regions.

Typically the substrate on which the various layers of the emitter are formed serves as the lower cladding region. Alternatively, a lower cladding region, separate from the substrate, may be formed between the substrate and the core region. The upper cladding region 16 and the core region 14 are illustratively formed in the shape of a mesa or trapezoid typical of ridge waveguide laser structures. The mesa may be deep-etched as shown to stop at or near the bottom of the core region 14, or it may be shallow-etched so that the mesa extends only through the upper cladding region.

In either case, an electrically insulating layer 18 (e.g., $Si_3N_4$ or $SiO_2$) is formed over the top of the device and is patterned to form an opening that exposes a portion of the top of the mesa. Alternatively, the insulating layer may comprise a chalcogenide glass of the type described by J. N. Baillargeon et al. in copending U.S. patent application Ser. No. 09/611,886 filed on Jul. 7, 2000, which is assigned to the assignee hereof and is incorporated herein by reference. A first electrode 20 is formed over the insulating layer 18 and in the opening so as to contact the upper cladding region (usually by means of a highly doped contact-facilitating layer, not shown), and a second electrode 22 is formed on the substrate 12.

The substrate itself may be a single crystal semiconductor body or a combination of such a body with another layer (e.g., an epitaxial layer grown on the top surface of the body). Illustratively, lasers of this type are fabricated from Group III-V compound semiconductors; e.g., In-based Group III-V compounds such as GaInAs and AlInAs for operation at mid-infrared wavelengths of about 4–24 μm. At shorter wavelengths, Group III-V compounds such as GaN and AlGaN may be used. Within any particular materials system the specific wavelength of operation is determined primarily by the thickness of the quantum wells that make up the RT regions.

Drive circuitry, not shown, is coupled across the electrodes in order to provide an external voltage bias and to supply pumping energy (e.g., electric current) to the laser of sufficient magnitude to generate light. Below threshold the emitter operates as an incoherent, spontaneous emission source, whereas above threshold it operates as a coherent, stimulated emission source. In the latter case, when provided with optical feedback, the source functions as laser. Suitable optical feedback is typically provided by an optical cavity resonator formed, for example, by cleaved crystal facets, distributed feedback (DFB) gratings, distributed Bragg reflectors (DBRs), or a combination of them. In FIG. 1 one cleaved facet of the resonator might be the end face depicted, whereas the other, parallel facet would be at the opposite end (not shown) of the laser.

Heterogeneous ISB Optical Devices

In accordance with one aspect of our invention, a HISB optical device, which itself may be a light emitter, a light absorber, or an optical waveguide, or any combination of thereof, includes a stack of at least two different ISB optical sub-devices in which the gain/loss profiles of the individual ISB sub-devices are mutually adapted, or engineered, so as to generate a predetermined overall function for the combination. Illustratively, the parameters of each individual ISB sub-device that might be subject to this engineering process include: the peak energy of the ISB optical transitions (emission or absorption) associated with each RT region, the position of each sub-device in the stack; the oscillator strengths of these ISB transitions; the energy bandwidth of each transition; and the total length of the RT and I/R regions of each ISB sub-device.

Figure 2:
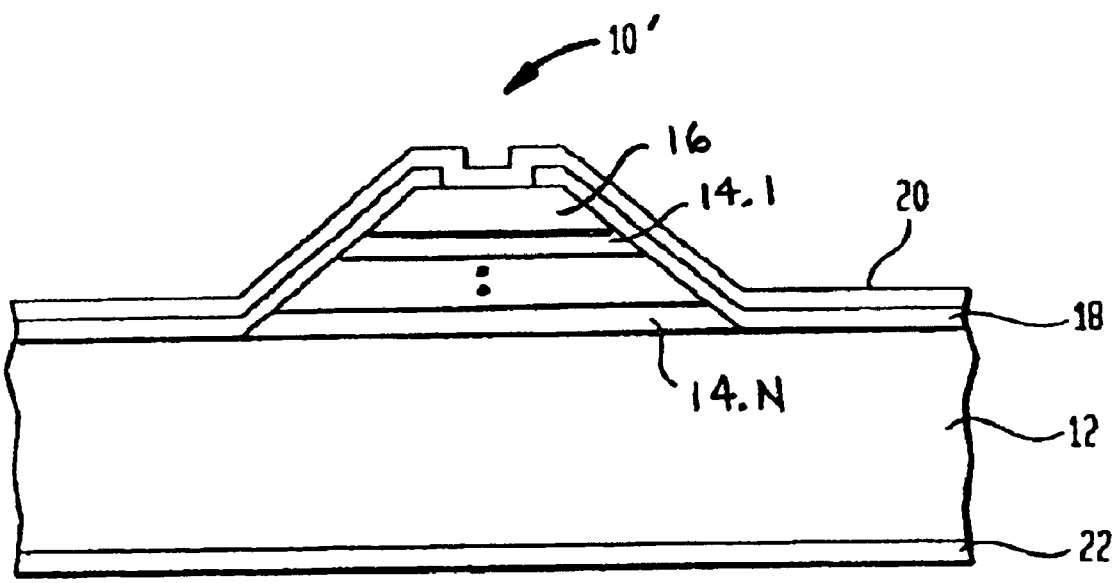
FIG. 2 is a schematic, cross-sectional view of a HISB device in accordance with one embodiment of our invention.
Figure 3:
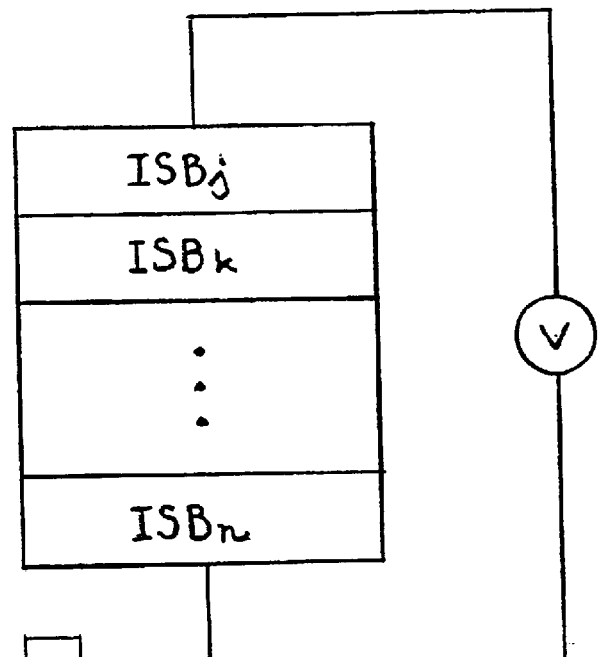
FIG. 3 is a schematic, block-diagrammatic view of a HISB device in accordance with one embodiment of our invention, such as the embodiment of FIG. 2.

In FIG. 2 we illustrate one embodiment of a HISB device 10' that is similar to the homogeneous device of FIG. 1 except that the core region includes a multiplicity of N stacked active regions 14.1–14.N at least two of which are different from one another; i.e., they have different individual gain/loss profiles. Each active region is a separate ISB sub-device that includes an RT region and an adjacent I/R region. Because the ISB sub-devices are unipolar, the order in which they are stacked can be chosen at will, as depicted in the block diagrammatic view of FIG. 3 where the individual active regions ISBj, ISBk, ISBn are labeled as separate ones of a multiplicity N of ISB sub-devices. Various parameters of the individual active regions or ISB sub-devices, as discussed above, are mutually adapted so that the overall HISB device 10' exhibits, generates or provides a predetermined function.

Figure 5:
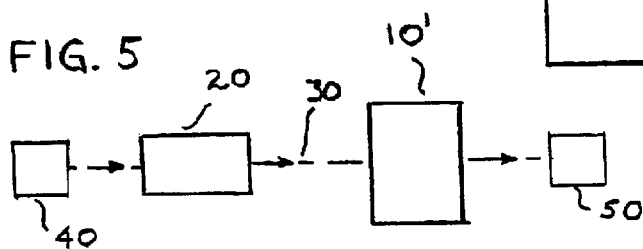
FIG. 5 is a block diagrammatic view of a system or subsystem including a tandem arrangement of a HISB and another optical device that has a characteristic property to be compensated, in accordance with yet another embodiment of our invention.

For example, as shown in FIG. 5, a system or subsystem includes a transmitter 40, a utilization device (e.g., a receiver) 50 and a transmission medium 30 (e.g., an optical fiber, an air path, or an integrated waveguide) that optically couples the transmitter to the utilization device. A HISB device 10' and another optical device 20 (e.g., an optical fiber, an optical amplifier, an optical waveguide, an optical coupler or optical multiplexer) are located in the transmission path. HISB 10' may be designed to compensate for the loss of device 20. FIG. 5 depicts the two devices as being arranged in tandem along a path defined by transmission medium 30. However, they could also be arranged in a different configuration; e.g., they could be stacked or integrated with one another. In either case, however, an illustrative loss characteristic of device 20 might be given by curve I of FIG. 4, which is typical of a well-known quadratic Drude loss function of a typical mid-infrared optical waveguide. To compensate for this loss characteristic the HISB 10' may be designed to have a gain function of the type depicted by curve II of FIG. 4. To this end, the peak wavelength $\lambda_0$ in μm as a function of location j of an active region 14.1–14.N in the stack is given by equation (1):

$$\lambda_0(j)=3.78\{1-1/[1+e^{[(j-15.9)/7.18]}]\}+4.55 \tag{1}$$

In this case, other parameters (e.g., oscillator strength, and total length of each stage) were maintained constant across the various stages. In one embodiment, the RTs of each stage of the HISB included three quantum wells, and for the case of 36 stages the peak wavelengths in μm were as follows, stage by stage: 5, 5, 5, 5, 5.1, 5.2, 5.3, 5.4, 5.5, 5.6, 5.75, 5.85, 5.95, 6.1, 6.2, 6.35, 6.45, 6.6, 6.7, 6.8, 6.95, 7.05, 7.15, 7.25, 7.4, 7.5, 7.6, 7.7, 7.8, 7.85, 7.9, 7.95, 8, 8, 8, and 8. This set of peak wavelengths does not exactly follow equation (1) because they have been adjusted slightly to compensate for the gain overshoot that occurs around 5 μm and 8 μm, as shown in FIG. 4.

In a similar fashion, curve I of FIG. 4 could represent the gain profile of device 20, and curve II the loss profile of HISB 10'.

Alternatively, curve I of FIG. 4 might represent the nonlinear refractive index profile of an external device 20 (e.g., the dispersion of an optical fiber) of FIG. 5, rather than its loss characteristic. Then, in a fashion similar to that outlined above, the gain/loss profile of HISB 10', which is related to its refractive index, can be engineered to produce a compensating nonlinear refractive index profile. Typically, the nonlinear refractive index profile of HISB 10' would be a mirror image (about the abscissa) of the refractive index profile of device 20 and hence opposite in sign.

As noted above HISB 10' might be used to compensate for the loss or nonlinear refractive index of an internal, integrated device such as the integrated waveguide formed by the cladding regions 12 and 16 of FIG. 2, in which case the core region of FIG. 2 would include the ISB sub-devices of HISB 10'. Of course, HISB 10' could also be designed to compensate for the characteristics of both an internal and an external device, if so desired.

In general the notion of compensation, whether in the context of loss or refractive index, does not require complete cancellation of the effect of the particular characteristic of device 20. As used herein, compensation also embraces partial cancellation or reduction of the effect.

Figure 6:
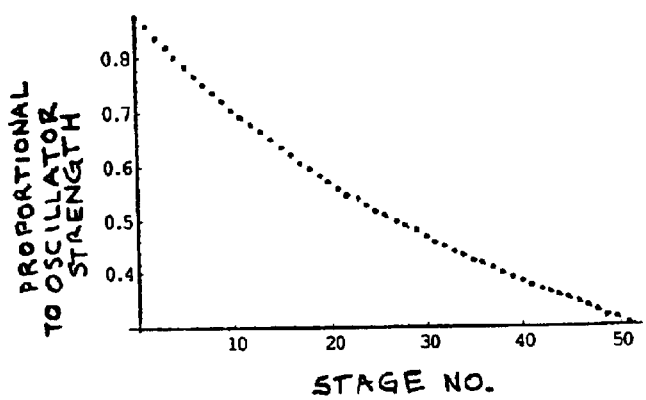
FIG. 6 shows the variation of oscillator strength across a HISB device in order to generate a relatively flat gain profile in the wavelength range of about 6.75–8.75 $\mu$m as shown in FIG. 7, in accordance with still another embodiment of our invention.

In another example, the HISB 10' may be designed to have a relatively flat gain profile over a particular wavelength range. Thus, consider that HISB has, for purposes of illustration, N=50 individual ISB sub-devices or stages. We design the 50 stages so that the energy positions of the peak emissions vary linearly in 50 1-meV increments, and, in addition, we design the oscillator strength of the individual ISB transitions so that they are proportional to the following series:

{0.8581, 0.838558, 0.81962, 0.80126, 0.78345, 0.766167, 0.749388, 0.733091, 0.717256, 0.701863, 0.686895, 0.672333, 0.658162, 0.644367, 0.630932, 0.617843, 0.605089, 0.592655, 0.58053, 0.568703, 0.557163, 0.5459, 0.534904, 0.524165, 0.513675, 0.503425, 0.493407, 0.483613, 0.474037, 0.46467, 0.455506, 0.446538, 0.437761, 0.429168, 0.420754, 0.412513, 0.40444, 0.396529, 0.388777, 0.381178, 0.373727, 0.366421, 0.359256, 0.352227, 0.34533, 0.338562, 0.33192, 0.325399, 0.318997, 0.31271, 0.306536}
This series is illustrated in the graph of FIG. 6. It is calculated from the area under the emission line of a single vertical transition active region, which is proportional to emission line intensity. The combination of engineering these two parameters (i.e., the peak positions and the oscillator strengths) in this fashion results in a calculated gain profile of FIG. 7, which is relatively flat over a wavelength range of about 6.75–7.75 $\mu$m. An even flatter profile could be realized by using an oscillator strength series which is proportional to $A^{-n}$, where A is proportional to the emission line intensity (the area under the spectral line) of a single vertical transition and n>1; or by increasing the number of stages, which also broadens the wavelength range of the profile; and/or by increasing the size of the increments of the energy positions, which also broadens the wavelength range of the profile. A relatively flat profile over an entirely different wavelength range could be realized by changing the material of the RT regions; e.g., by using GaN/AlGaN RT regions for wavelengths of less than about 5 $\mu$m (e.g., about 1–4 $\mu$m), or by using thicker quantum wells in the RT regions for wavelengths longer than about 8.5 $\mu$m.

In one more example, the HISB 10' may be designed to emit simultaneously at a plurality of different wavelengths. FIG. 8 illustrates the gain profile of such a HISB for the case of four different wavelengths. Here, the oscillator strengths of the four stages were designed to approximately match one another in peak intensity. The energy of the peak wavelength was varied linearly across the 4 stages; i.e., in 4 equal increments to produce emission at 8.5, 8.0, 7.56 and 7.2 $\mu$m. The corresponding oscillator strengths were proportional to 2.5, 1.4, 1.1 and 1.0, respectively. In this case the total length of the RT and I/R regions of each stage did not significantly affect the desired gain profile. A laser of this type could function as an ultra broadband source for use in a WDM system. It would have the advantage that no filtering would be required to generate the requisite carrier signals for each channel. One application of such a HISB laser might be in a free-space, optical wireless system. However, if the channel spacing is too close, as in currently commercial fiber optic WDM systems, then a HISB having a gain profile of the type shown in FIG. 4 could be used with appropriate filtering to generate carrier signals with the requisite channel spacing.

EXAMPLE

This example describes a Group III-V compound semiconductor, HISB laser in which the gain profile was designed to produce simultaneous emission at 5.2 $\mu$m and 8.0 $\mu$m, in accordance with one embodiment of our invention. Various materials, dimensions and operating conditions are provided by way of illustration only and, unless otherwise expressly stated, are not intended to limit the scope of the invention. As used herein, the term undoped means that a particular semiconductor layer or region is not intentionally doped; i.e., any doping of such a region or layer is relatively low and typically results from residual or background doping in the chamber used to grow the layers of the device.

We have experimentally demonstrated one embodiment of a HISB QC-laser having two individual ISB sub-devices, or laser active regions, stacked on top of one another in a configuration of the type shown in FIG. 2 for the case of N=2M and also shown in Inset (a) of FIG. 9. In one sub-device, stages 1 to M were identical to one another and the RT regions were designed to emit at about 5.2 $\mu$m, whereas in the other sub-device stages (M+1) to N were also identical to one another but the RT regions were designed to emit at about 8.0 $\mu$m. The ISB sub-devices were an essentially optimized QC structure (as discussed later) that emitted simultaneously at wavelengths of about 5.2 $\mu$m and 8.0 $\mu$m, with performance levels (at relatively low operating temperatures) essentially equal to their corresponding homogeneous QC lasers. Surprisingly, we did not find it necessary to adjust the design electric field of the HISB. Instead, the structure was evidently self-proportioning under an applied bias; i.e. each individual ISB sub-device was inherently apportioned an appropriate fraction of the applied bias. In addition, an etch-stop layer was inserted between the two ISB sub-devices. In another embodiment, as shown in Inset (b) of FIG. 9, this feature allowed us to fabricate an electrical "tap" into the cascade. The latter was used to selectively manipulate the laser threshold of one ISB sub-device, turning the 8.0 $\mu$m laser on and off while the conjoined 5.2 $\mu$m laser was operating undisturbed.

The structures were grown by molecular beam epitaxy (MBE) in the InGaAs/AlInAs material system lattice matched to an InP substrate. A 600 nm thick, relatively low-doped (n=5×10$^{16}$ cm$^{-3}$) InGaAs buffer layer was first grown on a relatively low-doped (n~5×10$^{17}$ cm$^{-3}$) InP-substrate, which simultaneously acted as the bottom cladding. The waveguide core included two ISB sub-devices each containing $N_p$=15 RT regions interleaved with suitable matching I/R regions. The bottom (top) stack, with total thickness of 704 nm (719 nm), employed a structure designed for emission at 8.0 $\mu$m (5.2 $\mu$m) as discussed in C. Gmachl et al., *IEEE J. Select. Topics Quantum Electron.*, Vol. 5, No.3, pp. 808–816 (1996) and J. Faist et al, *Appl. Phys. Lett.*, Vol. 68, No.26, pp. 3680–3682 (1996), both of which are incorporated herein by reference. The I/R regions were doped to a sheet density of 2.4×10$^{11}$ cm$^{-2}$ (3.1×10$^{11}$ cm$^{-2}$). The two ISB sub-devices were separated by a 50 nm thick InP etch-stop layer sandwiched between two 100 nm thick InGaAs layers. All three layers were relatively low-doped (n=5×10$^{16}$ cm$^{-3}$), since they were located in approximately the center of the waveguide core, where excess doping would result in increased waveguide losses. The core was capped by 400 nm of relatively low-doped InGaAs, 2.3 $\mu$m of relatively low-doped AlInAs (1.5 $\mu$m at n=1×10$^{17}$ cm$^{-3}$ followed by 800 nm at n=2×10$^{16}$ cm$^{-3}$), and 500 nm of relatively high-doped (n=1×10$^{17}$ cm$^{-3}$) InGaAs, which provided plasmon-enhanced confinement for 8.0 $\mu$m radiation, as described by C. Sirtori et al., *Appl. Phys. Lett.*, Vol. 66, No.24, pp. 3242–3244 (1995), which is incorporated herein by reference. We estimate waveguide losses $\alpha_{w8}$ and $\alpha_{w5}$ of 24 and 7 cm$^{-1}$, for the 8.0 and 5.2 $\mu$m wavelengths, respectively.

FIG. 9 shows the vertical mode profiles for the two wavelengths. We calculated confinement factors $\Gamma_8$ and $\Gamma_5$ (i.e., the overlap of the guided modes with the respective two active regions) of 0.21 and 0.26 for the 8.0 and 5.2 $\mu$m wavelength ISB sub-devices, respectively. FIG. 9 also shows schematic cross-sections of the two HISB devices, which were used in subsequent experiments; i.e., deep-etched mesas in Inset (a) and shallow-etched mesa in Inset (b). The latter were first etched selectively to the etch-stop layer. The etch-stop layer was then removed in a second selective etching process. SiN, 300 nm thick, was then applied as an insulation layer, and windows were formed on top of the mesa and to one side of it, 10–20 µm away from the ridge. Ohmic contact 20.2 was formed in the side window by evaporating Ge/Au/Ag/Au. This contact provided an electrical "tap" into the cascade. For both types of device, Insets (a) and (b), Ti/Au contact-metalization was evaporated on top of the mesa with bonding pads on the other side of the ridge. Back contact 22 was supplied in conventional fashion. The laser ridges were processed with stripe widths of about 12–18 µm, and the lasers were cleaved to a length of 2.25 mm, resulting in mirror losses $\alpha_{m8}$ and $\alpha_{m5}$ of about 5.6 cm$^{-1}$. Deep-etched round mesas with 120 µm diameter were also processed. Device characterization followed methods typically used with QC-laser structures.

FIG. 10 shows luminescence spectra measured at a 10 K heat sink temperature for various pulsed current levels, corresponding to below and above threshold current density values. The dashed line shows an as-measured spectrum When luminescence emission was measured from round mesas, light was typically collected through the substrate. Correcting, therefore, for the higher absorption losses experienced by the longer wavelength light in the doped substrate—the loss increased approximately quadratically with wavelength—and accounting also for the different detector sensitivities (and, implicitly, photon energies) at the two wavelengths, we obtained the spectra shown by the solid curves.

As can be seen, the peak emission intensities at the two wavelengths were almost identical and remained so over a wide range of current levels. Similarly, the integrated powers were equal within a few percent, with the emission at the 5.2 µm wavelength being slightly less powerful. Although equality was accidental, it is nevertheless a manifestation of the fact that both of the ISB sub-devices were optimized by maximizing the oscillator strengths and scattering lifetimes of their upper laser levels. The electro-luminescence power was proportional to the product $Ez^2\tau N_p I\eta$, where E is the photon energy (156 and 239 meV for 8.0 and 5.2 µm, respectively), z is the optical matrix dipole element (1.9 and 1.5 nm, respectively), and τ is the upper state scattering lifetime (1.7 and 1.6 ps for 8.0 and 5.2 µm, respectively). $N_p$=15, the number of RT regions, was chosen to be equal for both ISB sub-devices, and the current I was inherently the same for both due to their series arrangement. Finally, η, the collection efficiency, was accounted for in the corrected spectra. Therefore, we expected the electroluminescence power at 5.2 µm to be lower than the power at 8.0 µm by approximately 10%, which was in very good agreement with the experimental data. FIG. 10 also contains two Insets (a) and (b) showing laser spectra that exhibit characteristic Fabry-Perot modes of the as-cleaved 8.0 µm and 5.2 µm lasers, respectively.

FIGS. 11–12 show the light output-versus-current and voltage-versus-current characteristics of an HISB laser operated in pulsed mode at various heat sink temperatures. The laser was 12 µm wide and 2.25 mm long. FIG. 11 displays the power output at 8.0 µm, measured with a calibrated HgCdTe photovoltaic detector and employing a low-pass filter with a cut-off wavelength around 6.25 µm to suppress the 5.2 µm radiation. FIG. 12, on the other hand, shows the respective curves for the 5.2 µm emission (solid lines), as well as uncalibrated power measurements of both wavelengths simultaneously (dashed lines). The low-temperature threshold current densities were 2.67 kA/cm$^2$ and 2.70 kA/cm$^2$ for 8.0 and 5.2 µm, respectively. It was a general attribute of the lasers, that, at low temperatures, both wavelengths reached laser threshold at approximately the same current levels. Measured peak slope efficiency values were around 130 and 170 mW/A, and peak output power levels reached 300 and 220 mW for 8.0 and 5.2 µm wavelength, respectively, all measured at a 50 K heat-sink temperature. These values compared very favorably with similar lasers using a homogeneous cascade design, as described by Gmachl et al. and Faist et al., supra.

Using the gain coefficients of the two ISB sub-devices of 60 and 25 cm/kA for 8.0 and 5.2 µm, respectively) previously calculated by Gmachl et al. and Faist et al., supra and the waveguide parameters given above, we calculated threshold current densities of 2.35 and 1.95 kA/cm$^2$, respectively. In particular, for the longer wavelength very good agreement with the experimental values was achieved, which also means that no penalty on laser performance was experienced from its being conjoined with the 5.2 µm sub-device. The larger measured threshold current density at 5.2 µm was likely due to the experimental waveguide losses being larger than the calculated ones. Cross-absorption of the shorter wavelength radiation in the longer wavelength active region should, however, be ruled out due to the lack of suitable resonant energy levels there.

FIG. 11 also shows the voltage versus current characteristics of the same HISB laser. The low-temperature threshold voltage was ~7.5 V, and peak optical power was reached at an applied bias of ~9.5 V. From the design electric fields of the two ISB sub-devices, 45 kV/cm and 75 kV/cm for 8.0 and 5.2 µm, respectively, we expected an operating voltage of 8.56 V, in excellent agreement with the measured values. It is important to note that at the design electric field of the shorter wavelength sub-device (i.e. 75 kV/cm), the longer wavelength sub-device is no longer operable, because tunneling injection from the injector ground state into the upper laser state is not possible. Taking into account the large dynamic voltage range (~2 V) over which laser action was achieved for both wavelengths, it is evident, therefore, that each ISB sub-device was apportioned the appropriate fraction of the applied bias.

Figure 13:
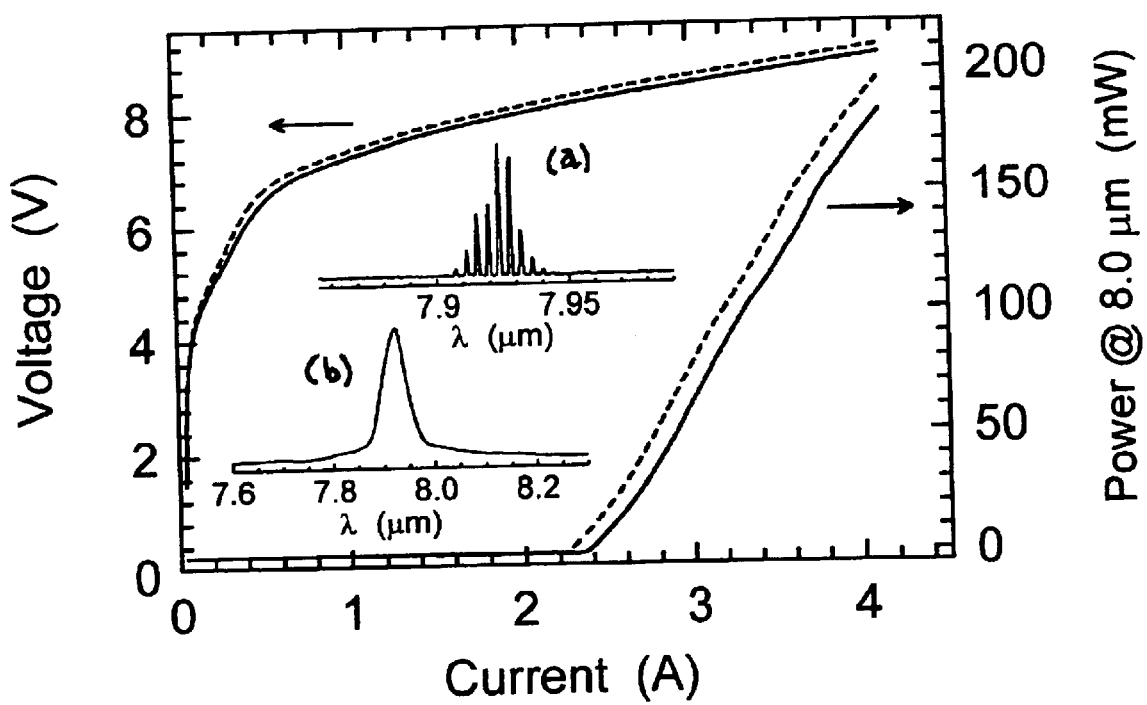
FIG. 13 shows pulsed L-I-V characteristics (L at a wavelength of 8.0 $\mu$m) for a tapped-cascade HISB laser of the type shown in FIG. 9, Inset (b). The laser was 13 $\mu$m wide and 2.25 mm long and was operated a heat sink temperature of 10 K. The dashed curves were obtained with the tap contact in open-circuit configuration; the solid curves were measured with the tap contact shorted to the bottom contact, thereby providing a relatively small bypass current for the 8.0 $\mu$m laser. The I-V characteristic was measured between the top and bottom contacts. The insets show the spectra obtained at 2.3 A of peak pump current. Inset (a) was measured with the tap in an open-circuit configuration; Inset (b) in a short-circuit configuration. The 5.2 $\mu$m laser emitted independent of the tap configuration.

Finally, FIG. 13 shows the performance of the "tapped" HISB laser, schematically displayed in Inset (b) of FIG. 9. In this device geometry, only the upper, 5.2 µm sub-device experiences current confinement; the lower, 8.0 µm sub-device has a broad-area configuration that allows considerable current spreading in the plane of the layers, which leads to a higher threshold current for the latter. This HISB laser was 13 µm wide (measured at the 5.2 µm sub-device) and 2.25 µm long. It exhibited a threshold current of 1.20 A for the 5.2 µm radiation at 10 K heat sink temperature. The threshold current of the 8.0 µm radiation, however, depended on the circuit configuration of the "tap". When the "tap" contact was left in an open-circuit configuration, we measured a threshold current of 2.24 A. However, when the "tap" contact was short-circuited to the bottom contact, the threshold increased to 2.36 A, a ~5% increase. This small shift of the threshold was due to the current that was extracted through the "tap" contact and bypassed the bottom sub-device. It is evident that a larger modulation of the laser threshold of the 8.0 µm sub-device should be feasible, e.g. by means of a more effective (i.e., thicker, or higher doped) "tap", or a deep-etched mesa configuration. In any case, this experiment provided a first proof of the principle that tapping into the cascade can be beneficially employed in ISB lasers.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, our HISB may function as a light absorber, as well as a light emitter, but in the former case doping is an additional parameter that might be included in the above-described engineering process. In this regard, it is important to note that ISB optical devices are essentially transparent on both sides of the peak wavelength of the ISB transition (notwithstanding the natural linewidth of the transition).

What is claimed is:

1. A heterogeneous intersubband (HISB) optical device having a predetermined function, said device comprising
a multiplicity of stacked intersubband (ISB) sub-devices, characterized in that
at least two of said sub-devices include radiative transition regions that have different individual gain/loss profiles, and
said individual gain/loss profiles are mutually adapted to generate said predetermined function.

2. The invention of claim 1 wherein said sub-devices have a set of characteristic parameters including the peak energy of the ISB transitions therein, the position of each sub-device in the stack, the oscillator strengths of said transitions, the energy bandwidth of said transitions, the length of said sub-devices, and the doping levels of said sub-devices, said individual gain/loss profiles being determined by mutually adapting said parameters.

3. The invention of claim 1 wherein said HISB device is designed to operate in conjunction with a second device having a gain/loss characteristic over a particular wavelength range, said individual gain/loss profiles being mutually adapted to generate said predetermined function as a gain/loss characteristic in said HISB device that compensates for said gain/loss characteristic of said second device.

4. The invention of claim 1 wherein said HISB device is designed to operate in conjunction with a second device having a nonlinear refractive index characteristic over a particular wavelength range, said individual gain/loss profiles being mutually adapted to generate said predetermined function such that said HISB device has a nonlinear refractive index characteristic that compensates for said nonlinear refractive index characteristic of said second device.

5. The invention of claim 1 wherein said individual gain/loss profiles are mutually adapted to generate said predetermined function as a relatively flat gain/loss profile over a particular wavelength range.

6. The invention of claim 1 wherein said HISB device comprises a laser for simultaneously operating at a plurality of different wavelengths.

7. The invention of claim 6 further comprising a transmitter that includes said HISB device, a utilization device for receiving radiation at said wavelengths generated by said HISB device, and a transmission medium for optically coupling said transmitter to said utilization device.

8. The invention of claim 6 wherein said individual gain/loss profiles are mutually adapted to generate said predetermined functions as a gain profile that exhibits peaks at a multiplicity of said different wavelengths.

9. The invention of claim 7 wherein said transmitter and said utilization device operate on the basis of wavelength division multiplexing of a multiplicity of channels, and radiation at each of said wavelengths emitted by said HISB device correspond to one of said channels.

10. The invention of claim 1 wherein each of said ISB sub-devices includes a radiative transition region and an injection/relaxation region adjacent thereto.

11. A heterogeneous intersubband (HISB) optical device having a predetermined gain/loss or nonlinear refractive index profile, said device comprising
upper and lower cladding regions,
a core region including a multiplicity of intersubband (ISB) active regions stacked between said cladding regions, each of said active regions including a plurality of radiative transition regions and interleaved therewith a plurality of injection/relaxation regions,
means forming an optical cavity resonator, said active regions being located within said resonator, characterized in that
at least two of said active regions including radiative transition regions that are different from one another, said active regions having a set of characteristic parameters including the peak energy of the ISB transitions therein, the position of each of said sub-devices in the stack, the oscillator strengths of said transitions, the energy bandwidth of said transitions, the length of said active regions, and the doping levels of said regions, and wherein said parameters are mutually adapted to generate said predetermined profile.

* * * * *